(12) United States Patent
Yuan

(10) Patent No.: US 10,073,292 B2
(45) Date of Patent: Sep. 11, 2018

(54) COLOR FILTER AND METHOD FOR MANUFACTURING THE SAME

(71) Applicant: Shenzhen China Star Optoelectronics Technology Co., Ltd., Shenzhen (CN)

(72) Inventor: Xialiang Yuan, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/897,663

(22) PCT Filed: Aug. 4, 2015

(86) PCT No.: PCT/CN2015/085998
§ 371 (c)(1),
(2) Date: Dec. 11, 2015

(87) PCT Pub. No.: WO2017/012145
PCT Pub. Date: Jan. 26, 2017

(65) Prior Publication Data
US 2018/0157100 A1 Jun. 7, 2018

(30) Foreign Application Priority Data

Jul. 21, 2015 (CN) .......................... 2015 1 0428504

(51) Int. Cl.
G02F 1/1335 (2006.01)
G03F 7/00 (2006.01)
G02F 1/1362 (2006.01)

(52) U.S. Cl.
CPC ...... *G02F 1/133514* (2013.01); *G02F 1/1335* (2013.01); *G02F 1/136209* (2013.01); *G03F 7/0007* (2013.01)

(58) Field of Classification Search
CPC ......... G02F 1/133514; G02F 1/133516; G03F 7/0007; G03F 1/38; G03F 1/50; G03F 1/56; G02B 5/201; G02B 5/223
(Continued)

(56) References Cited

U.S. PATENT DOCUMENTS

2001/0051305 A1* 12/2001 Lee ..................... G02B 5/201
430/7
2005/0001205 A1 1/2005 Malalel et al.
(Continued)

FOREIGN PATENT DOCUMENTS

CN 101435993 A 5/2009
CN 101581852 A 11/2009
(Continued)

OTHER PUBLICATIONS

Notification of Transmittal of the International Search Report and the Written Opinion of the International Searching Authority (Forms PCT/ISA/220, PCT/ISa/210, and PCT/ISA/237) dated Mar. 23, 2016, by the State Intellectual Property Office of People's Republic of China in corresponding International Application No. PCT/CN2015/085998. (12 pages).

(Continued)

*Primary Examiner* — John A McPherson
(74) *Attorney, Agent, or Firm* — Buchanan Ingersoll & Rooney PC

(57) ABSTRACT

A method for manufacturing a color filter is provided, including: preparing a photomask comprising a plurality of pixel units, the pixel units each comprising red, green, and blue color resist layers; preparing a first substrate coated with a photosensitive polyester layer; exposing the first substrate by a light source irradiating through the photomask, so that color resist elements of different colors are formed on the first substrate from reaction of light passing (Continued)

Figure 1:
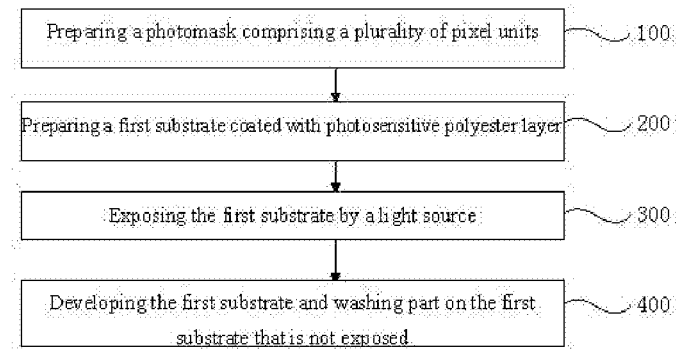

respectively through the red, green, and the blue color resist layers with the photosensitive polyester layer; and developing the first substrate and washing part of the first substrate that is not exposed. The method for manufacturing the color filter is simple in technique, thereby effectively reducing the production cost of the color filter.

10 Claims, 1 Drawing Sheet

(58) Field of Classification Search
USPC .................................. 430/5, 7; 349/106
See application file for complete search history.

(56) References Cited

U.S. PATENT DOCUMENTS

| | | | | |
|---|---|---|---|---|
| 2005/0221205 A1* | 10/2005 | Kim | ................ | G02F 1/133516 430/7 |
| 2009/0130486 A1 | 5/2009 | Zhou et al. | | |
| 2009/0130573 A1* | 5/2009 | Hyde | ................ | G03F 7/7035 430/5 |
| 2012/0308919 A1 | 12/2012 | Chen et al. | | |
| 2014/0132890 A1 | 5/2014 | Zhang | | |
| 2014/0192301 A1 | 7/2014 | Wu | | |

FOREIGN PATENT DOCUMENTS

| | | |
|---|---|---|
| CN | 101661204 A | 3/2010 |
| CN | 102213785 A | 10/2011 |
| CN | 10244943 A | 2/2013 |
| CN | 103033981 A | 4/2013 |
| CN | 103760717 A | 4/2014 |
| JP | 62-153903 A * | 7/1987 |

OTHER PUBLICATIONS

Office Action dated Aug. 18, 2017, by the State Intellectual Property Office of People's Republic of China in corresponding Chinese Patent Application No. 201510428504.8. (6 pages).

Office Action dated Mar. 12, 2018, by the State Intellectual Property Office of People's Republic of China in corresponding Chinese Patent Application No. 201510428504.8. (6 pages).

* cited by examiner

COLOR FILTER AND METHOD FOR MANUFACTURING THE SAME

CROSS REFERENCE TO RELATED APPLICATION

The present application claims the priority of Chinese patent application CN 201510428504.8, entitled "A Color Filter and A Method for Manufacturing the Same" and filed on Jul. 21, 2015, the entirety of which is incorporated herein by reference.

TECHNICAL FIELD

The present disclosure relates to the technical field of liquid crystal display, and in particular to a method for manufacturing a color filter.

TECHNICAL BACKGROUND

In manufacturing a liquid crystal display device, a color filter is a basepiece for realizing color display. A traditional color filter is usually prepared according to the following procedures: preparing a black matrix, red pixels, green pixels, blue pixels, transparent conductive film, and post spacers and the like. That is, pixels of different colors in the traditional color filter are formed in different steps. Because the manufacturing of the traditional color filter requires more preparing steps and complicated preparation technique, the production cost thereof is increased.

Directing against the problem of the above technology, it is a color filter with simple preparation technique that is sought in the art, thereby effectively reducing the production cost thereof and eliminating the defect of the color filter in the prior art.

SUMMARY OF THE INVENTION

In order to further simplify a preparation technique of a color filter, thereby reducing the production cost of the color filter, the present disclosure provides a method for manufacturing a color filter.

The method for manufacturing the color filter according to the present disclosure comprises: preparing a photomask comprising a plurality of pixel units, the pixel units each comprising red, green and blue color resist layers; preparing a first substrate coated with a photosensitive polyester layer; exposing the first substrate by a light source irradiating through the photomask, so that color resist elements of different colors are formed on the first substrate from reaction of light passing respectively through the red, the green and blue color resist layers with the photosensitive polyester layer; and developing the first substrate and washing part of the first substrate that is not exposed.

According to the method for preparing the color filter of the present disclosure, first, the red, the green and the blue color resist layers are formed on the photomask. Subsequently, the first substrate is exposed by a light source. The light emitted from the light source passes through the red, the green and the blue color resist layers, and light of a color can only penetrate the color resist layer of the same color. The penetrating lights react with the photosensitive polyester layer on the first substrate, thereby forming color resist elements of different colors on the first substrate. Finally, the first substrate is developed, and part of the first substrate that is not exposed to the light is washed, whereby the required color filter is obtained. The difference of the method for manufacturing the color filter according to the present disclosure from the prior art lies in that the color resist elements of different colors on the color filter of the present disclosure are formed in one single step. That is, the color resist elements of different colors are simultaneously formed on the first substrate after the light from the light source passes through the photomask. The method for manufacturing the color filter is simple in technique, thereby effectively reducing the production cost of the color filter.

In an embodiment, the procedure for preparing the photomask comprises forming a metal layer on a second substrate, and forming the pixel units on the metal layer. According to the embodiment, the pixel units are formed on the second substrate coated with the metal layer, so that light can pass only through the positions of the pixel units and be blocked on other parts of the metal layer. Preferably, the red, the green and the blue color resist layers in each of the pixel units are respectively formed by film coating.

In an embodiment, the procedure for preparing the photomask further comprises forming a protective layer after the pixel units are formed. The protective layer is used for protecting the pixel units on the photomask, so that the photomask can be repeatedly used.

In an embodiment, the photosensitive polyester layer is formed on a glass or plastic substrate so as to obtain the first substrate. Preferably, a black matrix is formed on the glass or plastic substrate prior to forming the photosensitive polyester layer. After corresponding color resist element is formed on the first substrate, transparent conductive film and post spacers are formed on the color resist element, whereby the manufacturing of the color filter can be completed.

In an embodiment, the photosensitive polyester is dichromic acid gelatin. Dichromic acid gelatin can react with light of different colors, and color resist elements of different colors can be formed from reacted dichromic acid gelatin which has been cured.

In an embodiment, the light source provides white light, which transforms into respective red light, green light, and blue light after passing through respective red, green, and blue color resist layers.

In an embodiment, the light source is a blue light source, and the red and green color resist layers are formed from respective quantum dots, while the blue color resist layer is configured as a transparent layer, wherein the red color resist layer at least comprises quantum dots that can be excited by the blue light to radiate red light, the green color resist layer at least comprises quantum dots that can be excited by the blue light to radiate green light, and the blue light directly penetrates the blue color resist layer. Preferably, the transparent layer is formed by removing the metal layer at a position corresponding to the transparent layer.

In an embodiment, light penetrating the red, the green, and the blue color resist layers as lights of corresponding colors have wavelengths respectively in ranges from 650 to 745 nm, from 500 to 560 nm, and from 459 to 485 nm. These ranges of wavelengths make human eyes more comfortable, whereby images displayed using the color resist elements thus formed can be more suitable for human eyes.

As compared with the prior art, the present disclosure has the following advantages. The color resist elements of different colors on the color filter of the present disclosure are formed in one single step. That is, the color resist elements of different colors are formed simultaneously on the first substrate after the light from the light source passes through the photomask. In addition, the photomask readily prepared can be repeatedly used. The method for manufacturing the color filter is simple in technique, thereby effectively reducing the production cost of the color filter.

BRIEF DESCRIPTION OF THE ACCOMPANYING DRAWINGS

Figure 2:
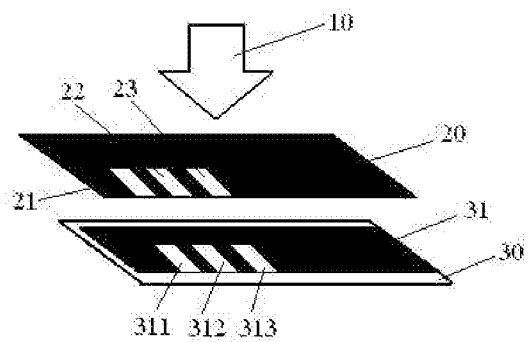
Figure 3:
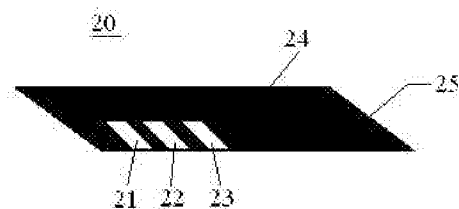

The present disclosure will be described in detail based on the examples in view of the accompanying drawings. In the drawings:

FIG. 1 shows a flow diagram of a method for manufacturing a color filter according to the present disclosure, FIG. 2 shows a schematic diagram of the method for manufacturing the color filter according to the present disclosure, and FIG. 3 schematically shows structure of a photomask used in the method for for manufacturing the color filter according to the present disclosure.

In the drawings, same components are indicated with the same reference sign. The drawings are not drawn to actual scale.

DETAILED DESCRIPTION OF THE EMBODIMENTS

The present disclosure will be described in detail in view of the accompanying drawings.

The details hereafter are only examples for illustrating the present disclosure, so as to provide description deemed as the most useful and comprehensible for understanding the principle and concept of the present disclosure. Herein, no description beyond the necessity for basically understanding the present disclosure is made in the structural detail. One skilled in the art can clearly understand how to embody the present disclosure in practice in view of the description and the accompanying drawings.

FIG. 1 shows a flow diagram of a method for manufacturing a color filter according to the present disclosure, specifically comprising the following steps.

In step 100, a photomask comprising a plurality of pixel units is prepared. The pixel units each comprise red, green, and blue color resist layers.

In step 200, a first substrate coated with photosensitive polyester layer is prepared.

In step 300, the first substrate is exposed by a light source, so that color resist of corresponding colors can be formed on the first substrate from reaction of light passing respectively through the red, the green, and the blue color resist layers with the photosensitive polyester layer.

In step 400, the first substrate is developed, and a part on the first substrate that is not exposed is washed.

In the method for preparing the color filter according to the present disclosure, as shown in FIG. 2, a red color resist layer 21, a green color resist layer 22, and a blue color resist layer 23 of each pixel unit are formed on a photomask 20. Subsequently, a first substrate 30 is exposed by a light source 10 through the photomask 20. Light from the light source 10 can only penetrate the red color resist layer 21, the green color resist layer 22, and the blue color resist layer 23, and light of a color can only penetrate the color resist layer of the same color. The penetrating lights react with a photosensitive polyester layer 31 on the first substrate 30, thereby forming a red color resist element 311, a green color resist element 312, and a blue color resist element 313 on the first substrate 30. The difference of the method for manufacturing the color filter according to the present disclosure from the prior art lies in that the red color resist element 311, the green color resist element 312, and the blue color resist element 313 on the color filter of the present disclosure are formed in one single step. That is, the color resist elements of different colors are formed simultaneously on the first substrate 30 after the light from the light source 10 passes through the photomask 20. The method for manufacturing the color filter is simple in technique, thereby effectively reducing the production cost of the color filter.

According to the present disclosure, the procedure for preparing the photomask in step 100 comprises forming a metal layer 24 on a second substrate 25, and forming the pixel units on the metal layer 24, as shown in FIG. 3. The pixel units each comprise the red color resist layer 21, the green color resist layer 22, and the blue color resist layer 23.

In the process of preparing the photomask 20, the pixel units are formed on the second substrate 25 coated with the metal layer 24, so that light from the light source 10 can penetrate only from the positions where the pixel units are formed. In another word, light can pass through only from the positions where the red color resist layer 21, the green color resist layer 22, and the blue color resist layer 23 are formed, and is blocked at other parts of the metal layer 24. Preferably, the red color resist layer 21, the green color resist layer 22, and the blue color resist layer 23 are formed on the second substrate 25 by film coating.

Preferably, the procedure form preparing the photomask 20 further comprises forming a protective layer after the pixel units are formed. The protective layer, which is not shown in the accompanying drawings, is made of transparent material, and can directly cover the entire photomask 20, so that the pixel units thereon can be protected, whereby the photomask 20 can be repeatedly used.

According to the present disclosure, in step 200, the photosensitive polyester layer 31 is formed on a glass or plastic substrate so as to obtain the first substrate 30. Preferably, a black matrix is formed on the glass or plastic substrate prior to forming the photosensitive polyester layer 31. In step 200, photosensitive polyester is used to react with light of different colors, thereby forming the red color resist element 311, the green color resist element 312, and the blue color resist element 313, namely color resist elements of the color filter, on the first substrate 30. Subsequently, transparent conductive film and post spacers are formed on the color resist elements thus obtained, whereby the preparation of the color filter is completed. Methods for preparing the black matrix, transparent conductive film, and the post spacers are the same as those in the prior art, thus will not be described in detail.

Preferably, the photosensitive polyester is dichromic acid gelatin. Dichromic acid gelatin can react with light of different colors, and color resist elements of corresponding colors can be formed from reacted dichromic acid gelatin which has been cured. For example, when the dichromic acid gelatin reacts with red light, red color resist elements will be formed, and when it reacts with green light, green color resist elements will be formed.

According to the present disclosure, the light source 10 can provide white light, which transforms into respective red light, green light, and blue light after passing through respective red color resist layer 21, green color resist layer 22, and blue color resist layer 23. The red light, green light, and the blue light respectively react with the photosensitive polyester layer 31, thereby forming the red color resist element 311, the green color resist element 312, and the blue color resist element 313. Preferably, light penetrating the red color resist layer 21, the green color resist layer 22, and the blue color resist layer 23 as lights of corresponding colors have wavelengths respectively in ranges from 650 to 745 nm, from 500 to 560 nm, and from 459 to 485 nm. These ranges of wavelengths make human eyes more comfortable, whereby images displayed using the red color resist element 311, the green color resist element 312, and the blue color resist element 313 thus formed can be more suitable for human eyes.

Moreover, the light source 10 can also be a blue light source. The red color resist layer 21 and green color resist layer 22 are formed from respective quantum dots, and the blue color resist layer 23 is configured as a transparent layer. The red color resist layer 21 at least comprises quantum dots that can be excited by the blue light to radiate red light, the green color resist layer 22 at least comprises quantum dots that can be excited by the blue light to radiate green light, and the blue light directly penetrates the blue color resist layer 23. Preferably, the transparent layer is formed by removing the metal layer 24 at a position corresponding to the transparent layer.

In conclusion, a production flow according to the present disclosure mainly comprises preparing the black matrix, preparing red, green, and blue pixels simultaneously, preparing the transparent conductive film, and preparing the post spacers. As compared with the prior art, the color resist elements of different colors on the color filter of the present disclosure is formed in one single step. That is, the color resist elements of different colors are formed simultaneously on the first substrate after the light from the light source 10 passes through the photomask 20. The photomask 20 obtained from the method for preparing the color filter according to the present disclosure can be repeatedly used. The method for manufacturing the color filter is simple in technique, thereby effectively reducing the production cost of the color filter.

It should be noted that the above examples are only for explaining, rather than restricting, the present disclosure. Although the present disclosure has been illustrated in view of the examples, it should be understood that the descriptive and illustrative language herein is not restrictive. Any person skilled in the art can make amendments to the present disclosure within the scope of the current and amended claims without departing from the spirit and scope thereof. Although the present disclosure has been described in view of specific method, material and examples, it is not limited to the detail given herein. On the contrary, the present disclosure can be extended to all structure, method and application with equivalent functions within, for example, the scope of the claims attached.

The invention claimed is:

1. A method for manufacturing a color filter, comprising:
preparing a photomask comprising a plurality of pixel units, the pixel units each comprising red, green and blue color resist layers,
preparing a first substrate coated with a photosensitive polyester layer,
exposing the first substrate by a light source irradiating through the photomask, so that color resist elements of different colors are formed on the first substrate from reaction of light passing respectively through the red, green and blue color resist layers with the photosensitive polyester layer, and
developing the first substrate and washing part of the first substrate that is not exposed,
wherein the light source is a blue light source, and the red and the green color resist layers are formed from respective quantum dots while the blue color resist layer is configured as a transparent layer, wherein the red color resist layer at least comprises quantum dots that can be excited by the blue light to radiate red light, the green color resist layer at least comprises quantum dots that can be excited by the blue light to radiate green light, and the blue light directly penetrates the blue color resist layer.

2. The method according to claim 1, wherein preparing the photomask comprises:
forming a metal layer on a second substrate, and
forming the pixel units on the metal layer.

3. The method according to claim 2, wherein the red, green and blue color resist layers in each of the pixel units are respectively formed by coating film.

4. The method according to claim 3, wherein preparing the photomask further comprises forming a protective layer after the pixel units are formed.

5. The method according to claim 2, wherein preparing the photomask further comprises forming a protective layer after the pixel units are formed.

6. The method according to claim 1, wherein preparing the photomask further comprises forming a protective layer after the pixel units are formed.

7. The method according to claim 1, wherein the photosensitive polyester layer is formed on a glass or plastic substrate so as to obtain the first substrate.

8. The method according to claim 7, wherein a black matrix is formed on the glass or plastic substrate prior to forming the photosensitive polyester layer.

9. The method according to claim 7, wherein the photosensitive polyester is dichromic acid gelatin.

10. The method according to claim 1, wherein the transparent layer is formed by removing a metal layer at a position corresponding to the transparent layer.

* * * * *